(12) United States Patent
Wei

(10) Patent No.: US 8,230,902 B2
(45) Date of Patent: Jul. 31, 2012

(54) HEAT-DISSIPATING ELEMENT AND HEAT SINK HAVING THE SAME

(75) Inventor: Wen-Chen Wei, Taipei Hsien (TW)

(73) Assignee: Neng Tyi Precision Industries Co., Ltd., Taipei Hsien (TW)

( * ) Notice: Subject to any disclaimer, the term of this patent is extended or adjusted under 35 U.S.C. 154(b) by 1163 days.

(21) Appl. No.: 12/076,877

(22) Filed: Mar. 25, 2008

(65) Prior Publication Data

US 2009/0194251 A1  Aug. 6, 2009

(30) Foreign Application Priority Data

Feb. 1, 2008 (TW) .............................. 97202290 U

(51) Int. Cl.
 *F28F 3/06* (2006.01)
(52) U.S. Cl. ......................................... 165/80.3; 165/76
(58) Field of Classification Search .................. 165/80.1, 165/80.3, 76
 See application file for complete search history.

(56) References Cited

U.S. PATENT DOCUMENTS

| 6,269,864 | B1 * | 8/2001 | Kabadi | 165/80.3 |
| 2006/0096741 | A1 * | 5/2006 | Hegde | 165/104.33 |

* cited by examiner

*Primary Examiner* — Teresa Walberg
(74) *Attorney, Agent, or Firm* — Rosenberg, Klein & Lee

(57) ABSTRACT

The present invention relates to a heat-dissipating element and a heat sink having heat-dissipating elements. The heat sink includes at least one substrate and a plurality of heat-dissipating elements. The substrate includes a base portion and a plurality of extending arms. Insertion slots are provided between each extending arm and two adjacent extending arms. Each heat-dissipating element is inserted in the corresponding insertion slot of the substrate. The lateral surfaces of each extending arm abut against the corresponding surfaces of the each heat-dissipating elements. A plurality of embossed heat-dissipating portions protrudes from at least one surface of each heat-dissipating element. According to the above, the present invention avoids the use of solders and heat transfer loss. Via the embossed heat-dissipating portions, the surface area of the heat-dissipating element for heat dissipation can be increased and thus the heat-dissipating effect is enhanced.

8 Claims, 11 Drawing Sheets

HEAT-DISSIPATING ELEMENT AND HEAT SINK HAVING THE SAME

BACKGROUND OF THE INVENTION

1. Field of the Invention

The present invention relates to a heat sink and a heat-dissipating element, and in particular to a heat-dissipating element whose surface is formed with embossed heat-dissipating portions and a heat sink comprising the heat-dissipating element.

2. Description of Related Art

Heat sinks are widely used with heat-generating electronic elements (e.g. CPUs) or lamps (e.g. halogen lamp, LED lamp etc.), to enhance the dissipation of heat. The heat sink having heat-dissipating fins is the most popular heat sink. FIG. 11 shows a conventional heat sink, in which a plurality of heat-dissipating fins 13 is arranged equidistantly on the top surface 111 of a base 11 by means of welding the solders 12.

The heat-dissipating fins 13 are used to increase the heat-dissipating area. With the bottom surface 112 of the base 11 contacting a heat source, the base 11 absorbs the heat and transmits the heat rapidly to surfaces 131 of each heat-dissipating fin 13, thereby facilitating the heat dissipation.

Since the heat-dissipating fins 13 are welded on the top surface 111 of the base 11, and the heat transfer coefficient of the solder 12 may be lower than that of the base 11 or the heat-dissipating fins 13, the solder 12 may inhibit the heat transfer between base 11 and heat-dissipating fins 13, which affects the heat-dissipating efficiency of the heat-sink.

Further, each surface 131 of the heat-dissipating fins 13 is a flat surface. Although the flat surface facilitates heat dissipation, the area of the flat surface can still be insufficient, resulting in an insufficient heat-dissipating effect. Therefore, it is an important issue to develop a heat sink that is capable of dissipating heat efficiently and improve the effect of the heat-dissipating element such as heat-dissipating fins.

Consequently, because of the above technical defects, the inventor keeps on carving unflaggingly through wholehearted experience and research to develop the present invention, which can effectively improve the defects described above.

SUMMARY OF THE INVENTION

The object of the present invention is to provide a heat-dissipating element whereby the use of solder and the heat transfer loss can be avoided and thus the heat-dissipating efficiency is improved, and a heat sink comprising the heat-dissipating elements.

In order to achieve the above objects, the present invention provides a heat-dissipating element in which a plurality of embossed heat-dissipating portions is formed to extend from at least one surface of the heat-dissipating element.

In order to achieve the above objects, the present invention further provides a heat sink having heat-dissipating elements, which includes: at least one substrate comprising a base portion and a plurality of extending arms extending from the base portion, insertion slots being provided between each extending arm and two adjacent extending arms; and at least heat-dissipating elements inserted in the corresponding insertion slots of the substrate, the lateral surfaces of the extending arms abutting against the corresponding surfaces of each heat-dissipating element, a plurality of embossed heat-dissipating portions protruding from at least one surface of each heat-dissipating element, which protrudes with its two ends from the top surface and the bottom surface of the substrate.

The present invention has advantageous effects as follows. The surface of the heat-dissipating element is formed with embossed heat-dissipating portions, which increases the surface area of the heat-dissipating element for heat dissipation. In comparison with the conventional heat-dissipating element having a flat surface such as heat-dissipating fins, the present invention can increase the heat-dissipating rate and improve the heat-dissipating effect of the electronic element.

Further, in the heat sink of the present invention, the insertion slots between each extending arm of the substrate allow the heat-dissipating elements to be inserted therein. The two lateral surfaces of each extending arm hold and fix the heat-dissipating elements tightly. In comparison with the conventional way of fixing the heat-dissipating element by welding, the present invention can avoid the solders and the heat transfer loss.

In order to further understand the characteristics and technical contents of the present invention, a detailed description relating thereto will be made with reference to the accompanying drawings. However, the drawings are illustrative only, but not used to limit the scope of the present invention.

DETAILED DESCRIPTION OF THE PREFERRED EMBODIMENTS

Figure 1B:
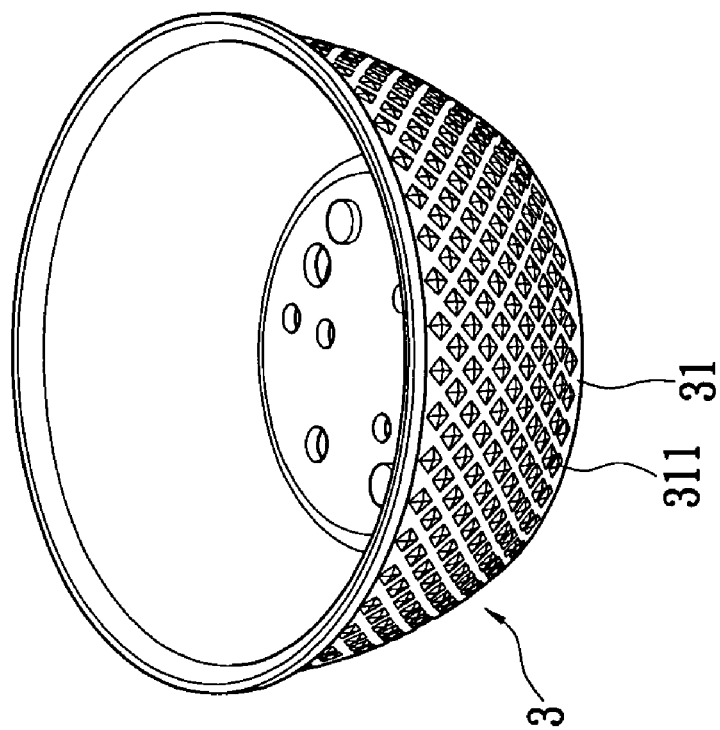
FIG. 1B is a perspective view showing another heat-dissipating element of the present invention.
Figure 1A:
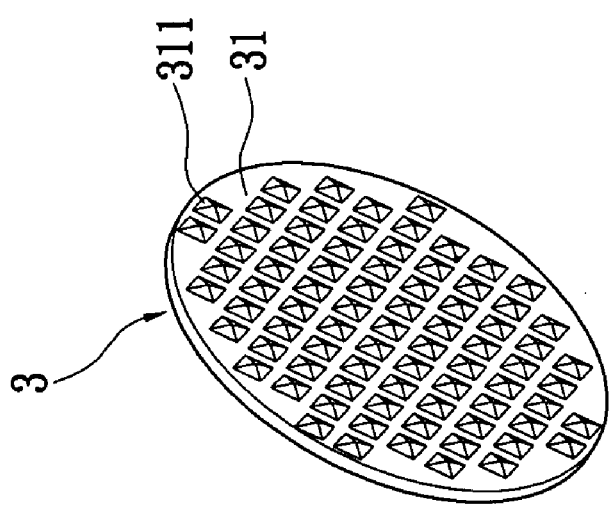
FIG. 1A is a perspective view showing the heat-dissipating element of the present invention.
Figure 2:
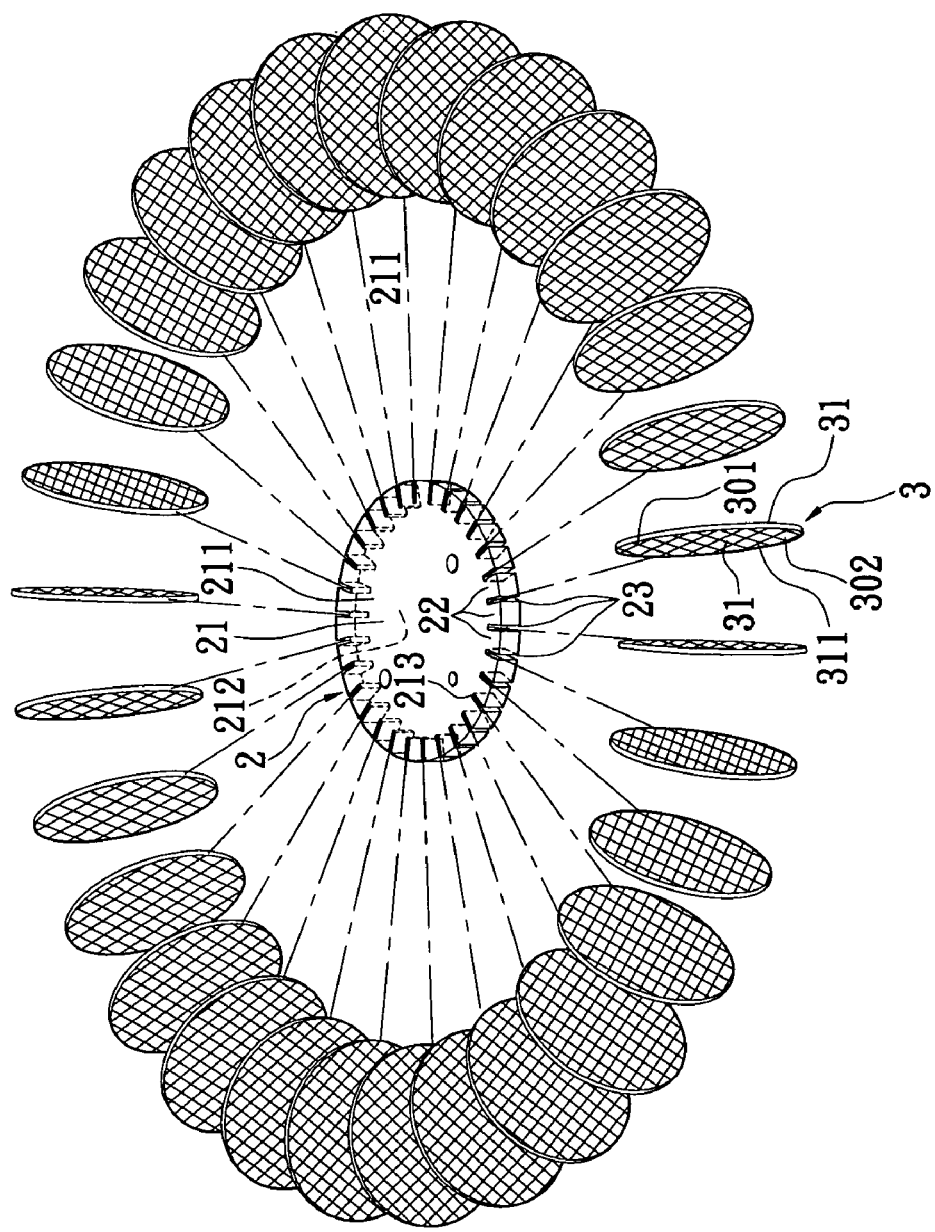
FIG. 2 is an exploded perspective view showing the heat sink of the present invention.
Figure 3:
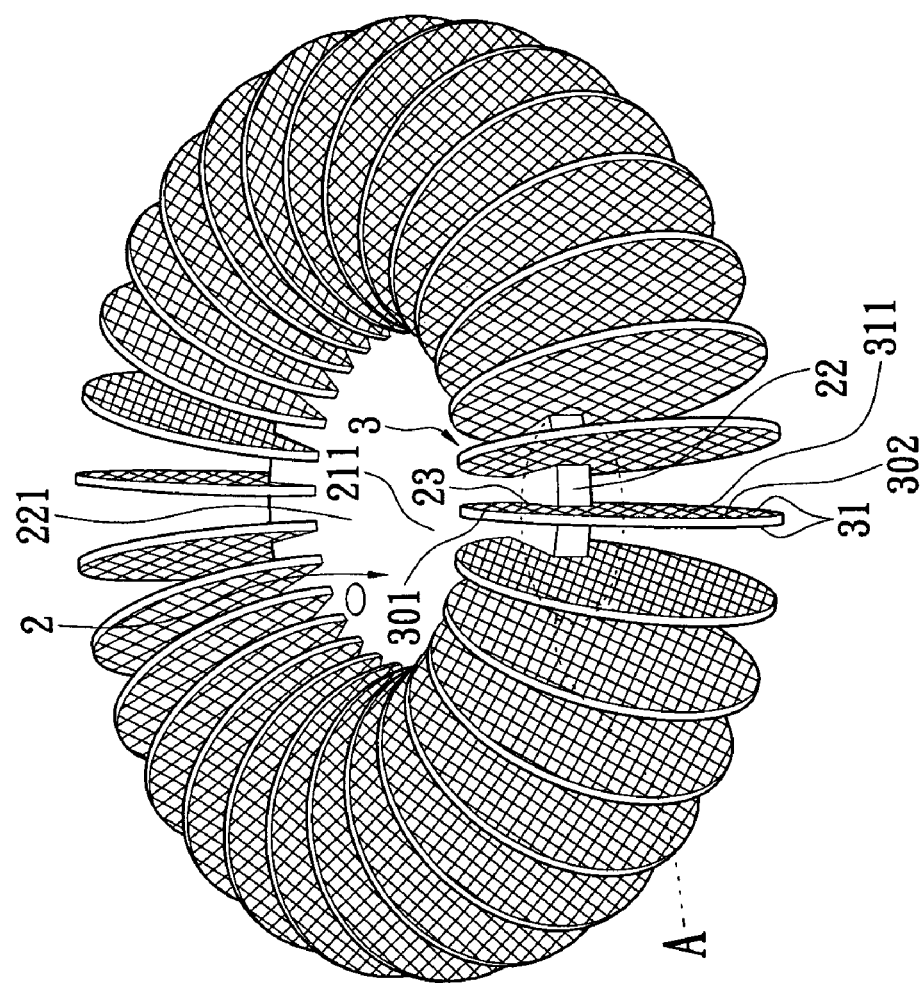
FIG. 3 is an assembled perspective view showing the heat sink of the present invention.
Figure 4:
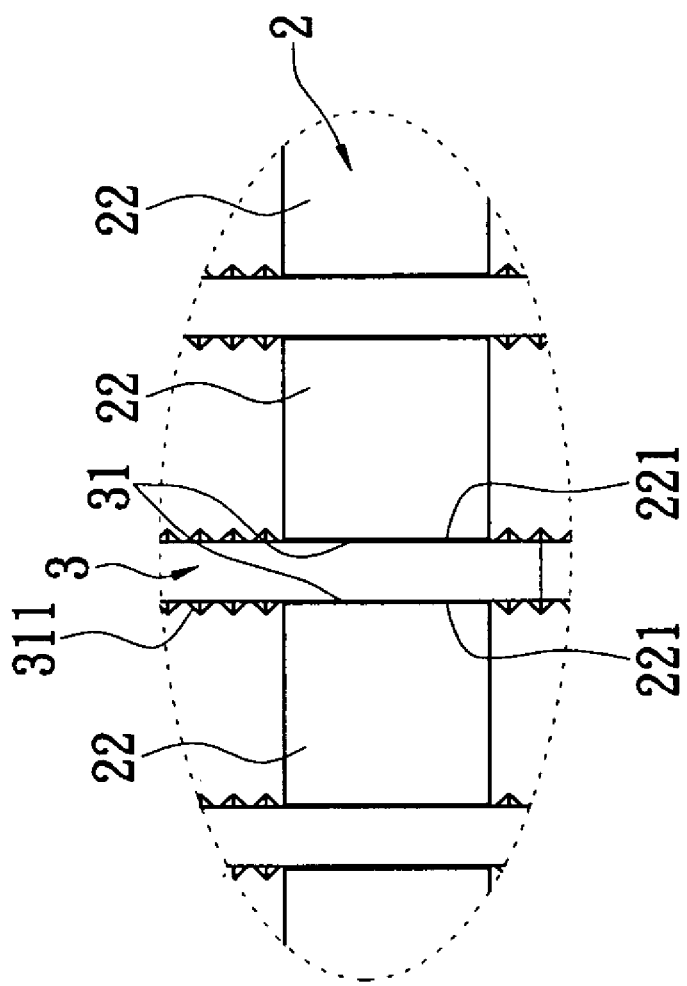
FIG. 4 is a front view showing the portion A of FIG. 3.

Please refer to FIGS. 1A and 1B. The present invention provides a heat-dissipating element 3. A plurality of embossed heat-dissipating portions 311 protrude from at least one surface 31 of the heat-dissipating element 3, thereby increasing the surface area of the heat-dissipating element 3 for heat dissipation and improving the heat-dissipating efficiency. Each embossed heat-dissipating portion 311 is formed into a square pyramid. As shown in FIG. 1A, the heat-dissipating element 3 is a heat-dissipating fin. Preferably, the plurality of embossed heat-dissipating portions 311 protrude from both surfaces 31, thereby achieving the optimal heat-dissipating effect. Alternatively, as shown in FIG. 1B, the heat-dissipating element 3 is a metallic lamp shade, and the embossed heat-dissipating portions 311 are formed on the external surface of the heat-dissipating element 3. In this way, when the metallic lamp shade is used, the surface area for heat dissipation can be further increased, thereby improving the heat-dissipating effect. Forming the plurality of embossed heat-dissipating portions 311 on the surface of the heat-dissipating element 3 can further improve the heat-dissipating efficiency by 5%.

Please refer to FIGS. 2 to 6. The present invention further provides a heat sink having heat-dissipating elements, which includes a heat sink plate 2 (hereinafter referred to as the substrate 2) and a plurality of heat-dissipating fin 3 (hereinafter referred to as the heat-dissipating elements 3).

The substrate 2 comprises a base portion 21 and a plurality of extending arms 22. The base portion 21 has a top surface 211, a bottom surface 212 and rims 213. Insertion slots 23 are formed between each extending arm 22 and two adjacent extending arms 22. The base portion 21 may be a circular plate or a polygonal plate. In the drawings, the base portion is shown as a circular plate.

Figure 5:
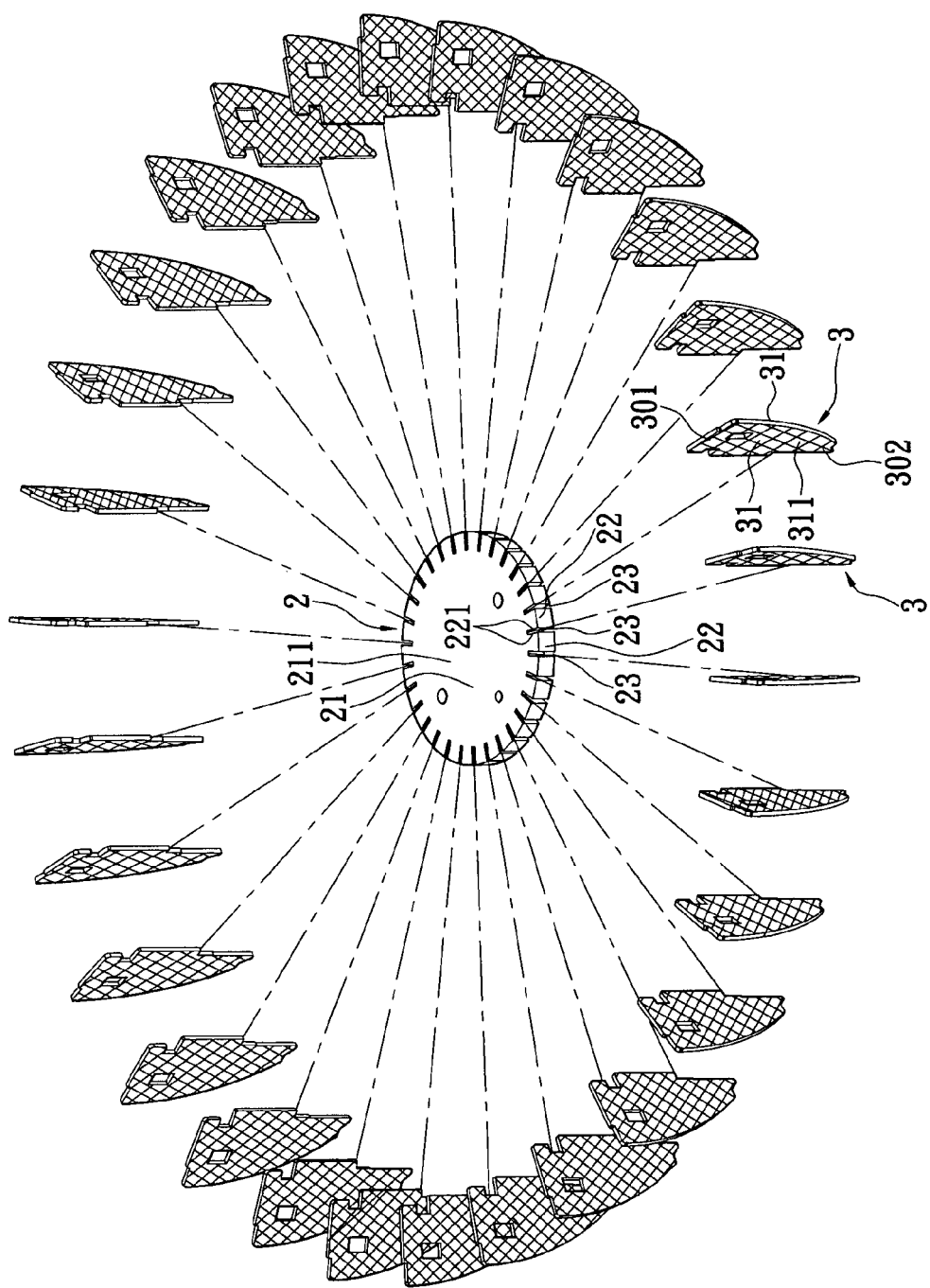
FIG. 5 is another exploded perspective view showing the heat sink of the present invention.

Each heat-dissipating element 3 is a heat-dissipating fin, which can be formed as a circular plate (FIG. 2) or a polygonal plate (FIG. 5). Each heat-dissipating element 3 has a top end 301 and a bottom end 302 opposite to each other, and has two opposite surfaces 31. A plurality of embossed heat-dissipating portions 311 protrudes from at least one surface 31 of each heat-dissipating element 3. Preferably, the embossed heat-dissipating portions 311 protrude from the two opposite surfaces 31. Further, the embossed heat-dissipating portions 311 of each heat-dissipating element 3 are formed into square pyramids by means of an embossing process.

Each heat-dissipating element 3 is inserted into the corresponding insertion slot 23 of the substrate 2. The lateral 221 surfaces of the extending arms 22 of the substrate 2 abut against the corresponding surfaces 31 of the heat-dissipating elements 3, thereby clamping each heat-dissipating element 3 tightly. The top end 301 and the bottom end 302 of each heat-dissipating element 3 protrude from the top surface 211 and the bottom surface 212 of the substrate 2 respectively.

In the present embodiment, the connection between each heat-dissipating element 3 and the substrate 2 can be achieved by a punching process. In this way, each extending arm 22 of the substrate 2 can be pressed to abut against the surface 31 of the corresponding heat-dissipating element 3 tightly.

Figure 6:
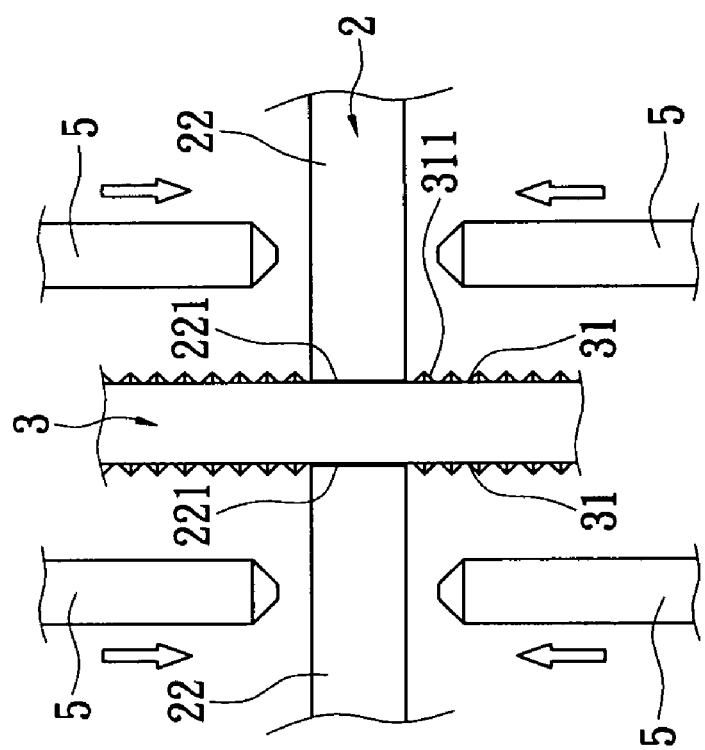
FIG. 6 is a schematic view showing a condition that punches are used to press the extending arm of the substrate to deform the extending arm plastically.

Please refer to FIG. 6. The above-mentioned punching process utilizes a plurality of punches 5 to press the top surface and bottom surface of the extending arm 22 of the substrate 2 in two directions so as to deform the extending arm 22 plastically. In this way, the two lateral surfaces 221 of each extending arm 22 abut against the corresponding surfaces 31 of the heat-dissipating element 3.

Figure 7:
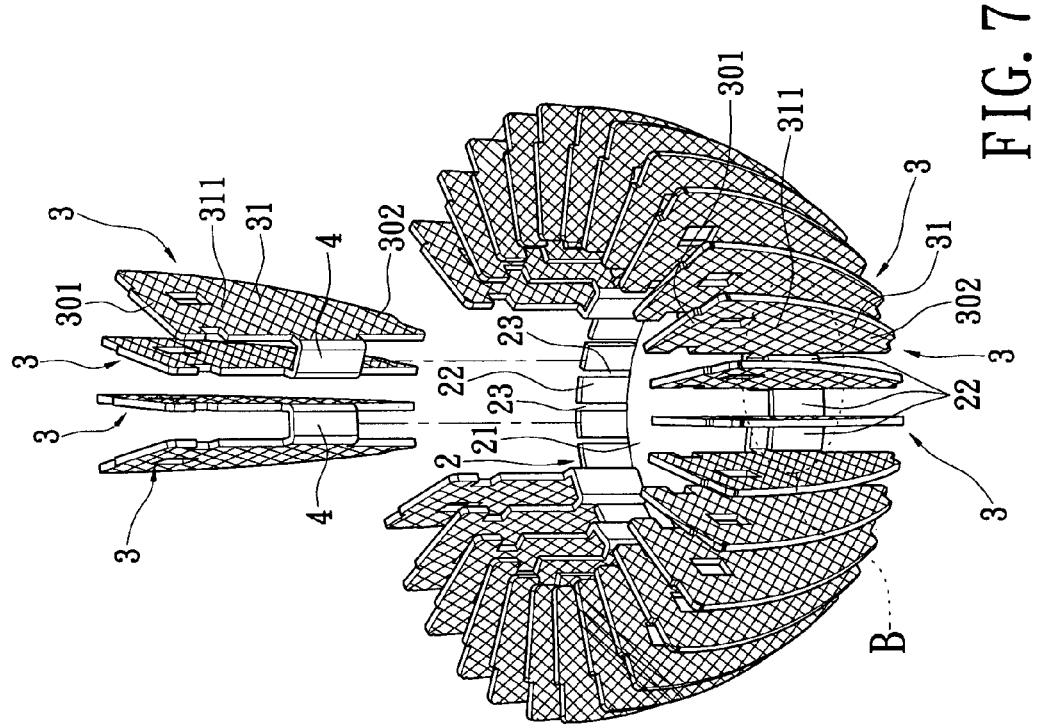
FIG. 7 is a perspective view showing the heat sink of another embodiment of the present invention.
Figure 8:
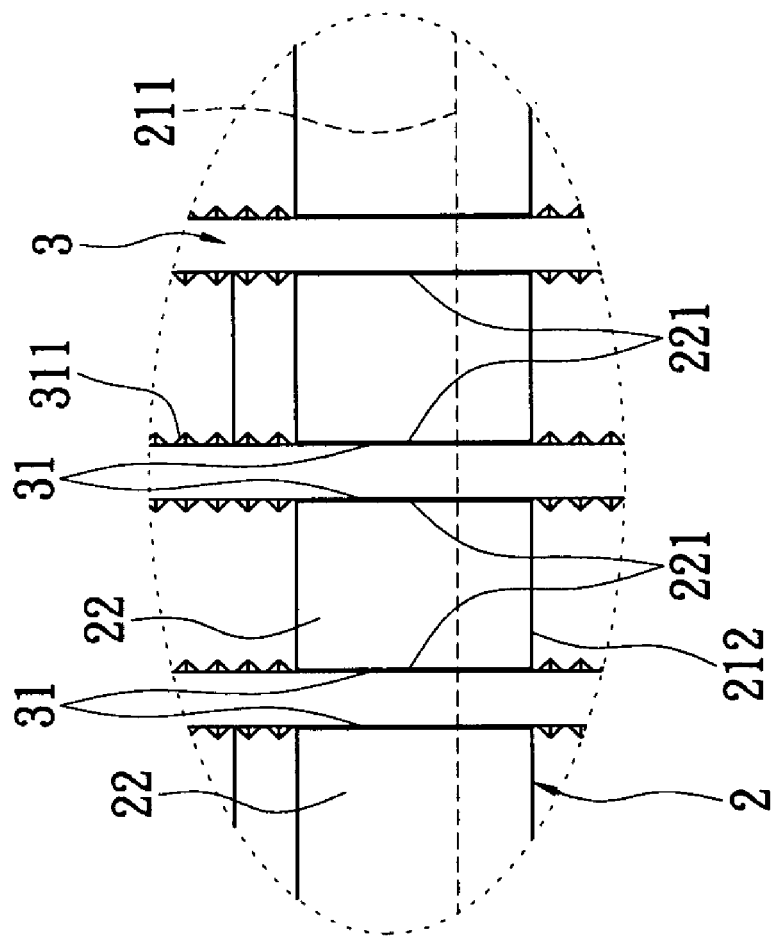
FIG. 8 is a front view showing the portion B of FIG. 7.

Please refer to FIGS. 7 and 8, which show another embodiment of the present invention. The difference between this embodiment and the previous embodiment lies in the fact that each extending arm 22 of the substrate 2 is formed by means of bending and extending from the rim 213 of the base portion 21.

In addition, a connecting portion 4 (hereinafter referred to as the connecting piece 4) can be provided between two heat-dissipating elements 3. Both sides of the connecting piece 4 are integrally connected to the two heat-dissipating elements 3, so that the two heat-dissipating elements 3 can be connected in pairs, and the pair of heat-dissipating elements 3 and the connecting piece 4 are defined as an U-shaped heat-dissipating component.

Similarly, each heat-dissipating element 3 is inserted into the corresponding insertion slot 23 of the substrate 2. As mentioned above, the two lateral surfaces 221 of each extending arm 22 of the substrate 2 abut tightly against the two corresponding surfaces 31 of each heat-dissipating element 3.

In the present embodiment, the free ends of the extending arms 22 of the substrate 2 are bent toward the base portion 21. In this way, each extending arm 22 can be bent to press, so that both lateral surfaces 221 can abut against the corresponding heat-dissipating element 3. In this way, each heat-dissipating element 3 can be pressed against firmly against the side edge of the substrate 2 firmly. In other words, each one of the U-shaped heat-dissipating components is horizontally straddled on one of the extending arms 22 of the heat sink plate 2 in a radial arrangement. Moreover, an inner surface of the connecting portion 4 of each U-shaped heat-dissipating component establishes thermal contact with an inner surface of the straddled extending arm 22, and the connecting portions 4 are disposed on the base portion 21. The heat-dissipating fins 3 are inserted in the insertion slots 23 and fixed onto the heat sink plat 2 by punching the extending arms 22.

Figure 9:
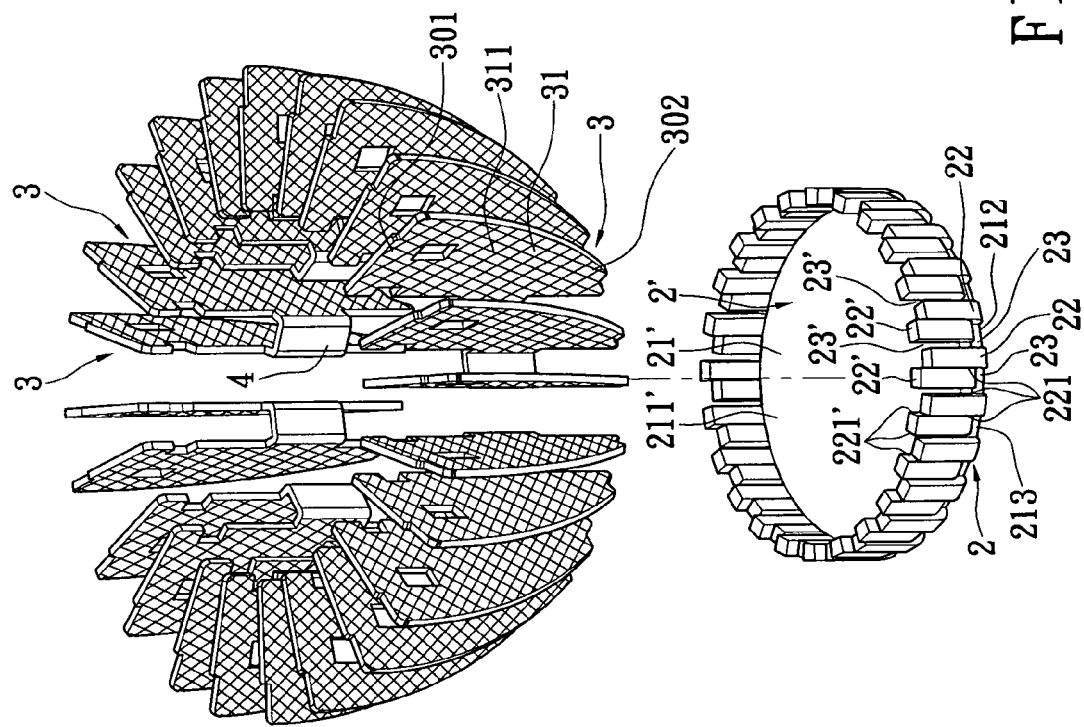
FIG. 9 is a partially exploded perspective view showing the heat sink of a further embodiment of the present invention.
Figure 10:
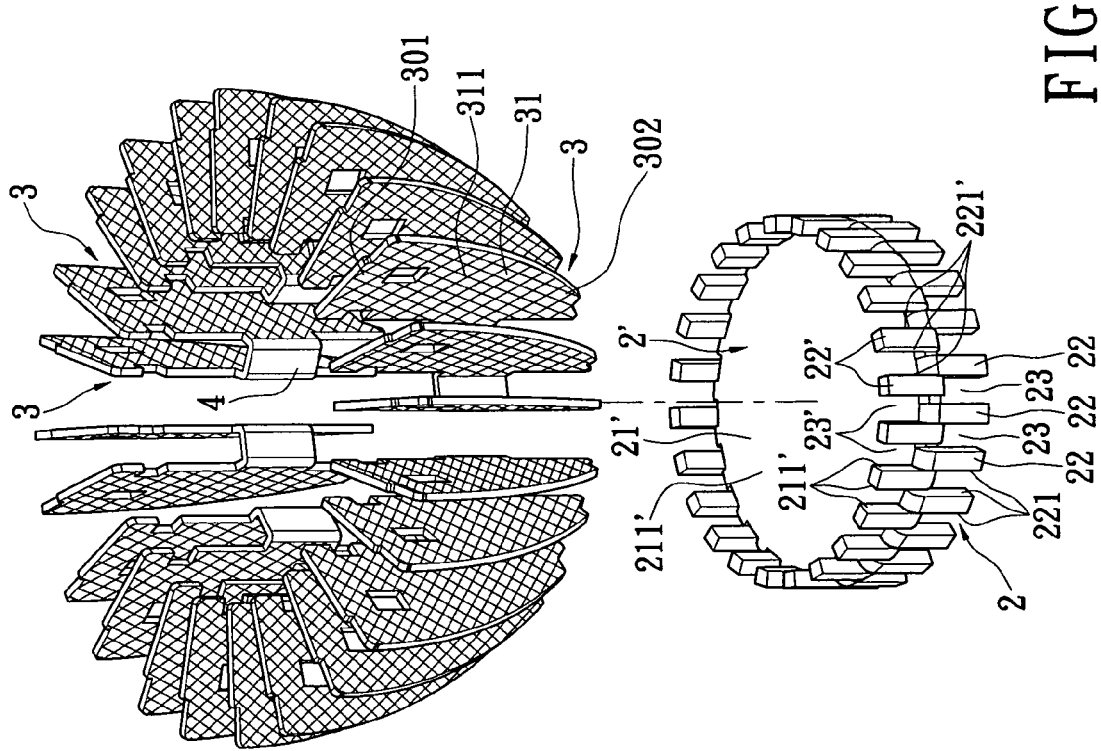
FIG. 10 is another partially exploded perspective view showing the heat sink of a further embodiment of the present invention.
Figure 11:
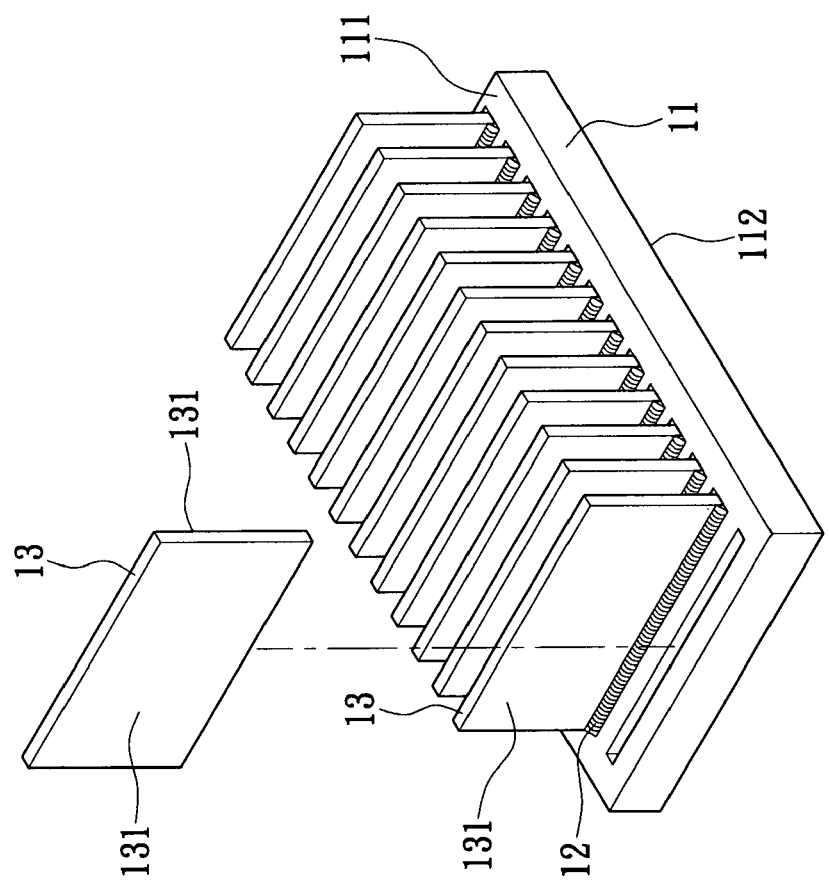
FIG. 11 is a perspective view showing a conventional heat sink.

Please refer to FIGS. 9 and 10, which show a further embodiment of the present invention. The difference between this embodiment and the previous embodiments lies in that it includes a first heat sink plate 2 and a second heat sink plate 2' (hereinafter referred to as the two symmetrical substrates 2, 2'). The two substrates 2, 2' overlap each other. Each extending arm 22' of one substrate 2' is located to correspond to the insertion slot 23 of the other substrate 2. In other words, the extending arms 22, 22' of the first and the second heat sink plates 2, 2' are arranged in a staggered manner, and each extending arm 22 of the first heat sink plate 2 contacts the corresponding extending arm 22' of the second heat sink plate 2' to define an arm set. Each extending arm 22, 22' of the two substrates 2, 2' are formed by bending and (vertically) extending from the rims 213, 213' of the two base portions 21.

Each heat-dissipating element 3 is disposed in the insertion slots 23, 23' between the two substrates 2, 2'. In other words, a plurality of slots defined between each two adjacent arm sets, and the heat-dissipating fins 3 may be inserted in the slots and fixed onto the first and the second heat sink plats 2, 2'. Each one of the U-shaped heat-dissipating components is straddled one of the arm sets, and the connecting portions 4 are disposed on the base portion 21' of the second heat sink plate 2'. Similarly, one of the two lateral surfaces 221, 221' forming each extending arm 22, 22' of the two substrates 2, 2' abuts against one of the two surfaces 31 of each heat-dissipating element 3.

Further, as shown in FIG. 9, the free ends of the extending arms 22, 22' of the two substrates 2, 2' extend in the same direction. At this time, the inner surface of the connecting portion 4 of each U-shaped heat-dissipating component contacts the inner surface of the straddled extending arm 22, 22' of the first and the second heat sink plates 2, 2'. Alternatively, as shown in FIG. 10, the free ends of the extending arms 22, 22' of the two substrates 2, 2' extend in opposite directions. At this time, the inner surface of the connecting portion 4 of each U-shaped heat-dissipating component contacts the inner surface of the straddled extending arm 22 of the first heat sink plate 2.

In the present embodiment, the free ends of the extending arms 22, 22' of the two substrates 2, 2' are bent toward the two substrates 21, 21'. Each extending arm 22, 22' can be bent to press, so that both lateral surfaces 221, 221' can abut against the corresponding heat-dissipating element 3 tightly. In this way, each heat-dissipating element 3 can be fixed to the side edge of the two substrates 2, 2' firmly.

According to the above-mentioned embodiments, in the heat-dissipating element 3 of the present invention, a plurality of embossed heat-dissipating portions 311 protrudes from two opposite surfaces 31 of the heat-dissipating element 3, thereby increasing the surface area of the heat-dissipating element 3 for heat dissipation. Further, the heat-dissipating element 3 of the present invention can be applied to any kinds of heat sinks, but not limited to the above-mentioned heat sinks.

According to the above, in the present invention, the insertion slots 23, 23' between each extending arm 22, 22' of one or two substrates 2, 2' can allow the heat-dissipating element 3 to be inserted therein. Two lateral surfaces 221, 221' of each extending arm 22, 22' abut and hold the heat-dissipating element 3 firmly. In comparison with the conventional way of fixing the heat-dissipating element by welding, the present invention avoids the use of solders and the heat transfer loss. On the other hand, avoiding the use of solders really conforms to the requirements for environmental protection because the solder contains lead while lead-free solders increases the cost.

Next, the top surface 211 or bottom surface 212 of the substrate 2 (alternatively, one top surface 211' or one bottom surface 212' of the two substrates 2, 2') can be used to contact a heat-generating element (such as a LED lamp). The top end 301 and the bottom end 302 of each heat-dissipating element 3 protrude from the top surface 211, 211' and the bottom surface 212 of one or two substrates 2, 2'. In this way, the cooling/heating airflow can be introduced in or out of the top surfaces 211, 211' and the bottom surface 212 in two directions, thereby achieving the heat-dissipating effect of the electronic element more easily.

Further, forming the embossed heat-dissipating portions 311 on at least one surface 31 of each heat-dissipating element 3 can increase the surface area of each heat-dissipating element 3 for heat dissipation. In comparison with the heat-dissipating element having a flat surface such as a heat-dissipating fin, the present invention increases the heat-dissipating rate and the heat-dissipating effect by 5%, thereby enhancing the heat-dissipating effect of the electronic element.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat sink, comprising:
   a heat sink plate, having a base portion and a plurality of extending arms substantially vertically extended from the base portion around the circumferential thereof,
   wherein a plurality of insertion slots are defined between each two adjacent extending arms,
   a plurality of U-shaped heat-dissipating components, each having a pair of heat-dissipating fins and one connecting portion integrally connected between the heat-dissipating fins,
   wherein each one of the U-shaped heat-dissipating components is horizontally straddled on one of the extending arms of the heat sink plate, wherein an inner surface of the connecting portion of each U-shaped heat-dissipating component establishes contact with an inner surface of the straddled extending arm, and wherein the heat-dissipating fins are inserted in the insertion slots and fixed onto the heat sink plate by punching the extending arms.

2. The heat sink according to claim 1, wherein a plurality of embossed heat-dissipating portions are protruded from at least one surface of each heat-dissipating fin.

3. The heat sink according to claim 1, wherein the connecting portions are disposed on the base portion.

4. A heat sink, comprising:
   a first heat sink plate and a second heat sink plate, each having a base portion and a plurality of extending arms substantially vertically extended from the circumferential portion of the base portion,
   wherein the base portion of the first heat sink plate overlaps the base portion of the second heat sink plate,
   wherein the extending arms of the first and the second heat sink plates are arranged in a staggered manner, and each extending arm of the first heat sink plate contacts each extending arm of the second heat sink plate to define an arm set,
   wherein a plurality of slots are defined between each two adjacent arm sets; and
   a plurality of U-shaped heat-dissipating components, each having a pair of heat-dissipating fins and one connecting portion integrally connected between the heat-dissipating fins,
   wherein each one of the U-shaped heat-dissipating components is horizontally straddled on one of the arm sets, wherein an inner surface of the connecting portion of each U-shaped heat-dissipating component establishes contact with an inner surface of the straddled extending arm of the first heat sink plate, and wherein the heat-dissipating fins are inserted in the slots and fixed onto the first and the second heat sink plates by punching the arm sets.

5. The heat sink according to claim 4, wherein a plurality of embossed heat-dissipating portions are protruded from at least one surface of each heat-dissipating fin.

6. The heat sink according to claim 4, wherein the connecting portions are disposed on the base portion of the second heat sink plate.

7. The heat sink according to claim 4, wherein the free ends of the extending arms of the two heat sink plates extend in the same direction, and the inner surface of the connecting portion of each U-shaped heat-dissipating component contacts an inner surface of the straddled extending arm of the second heat sink plate.

8. The heat sink according to claim 4, wherein the free ends of the extending arms of the two heat sink plates extend in opposite directions.

* * * * *